United States Patent
Kubota et al.

(10) Patent No.: US 8,710,710 B2
(45) Date of Patent: Apr. 29, 2014

(54) METHOD OF FABRICATING CRYSTAL UNIT, CRYSTAL UNIT FABRICATION MASK, AND CRYSTAL UNIT PACKAGE

(75) Inventors: Hajime Kubota, Kawasaki (JP);
Masayuki Itoh, Kawasaki (JP);
Masakazu Kishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 74 days.

(21) Appl. No.: 13/137,630

(22) Filed: Aug. 30, 2011

(65) Prior Publication Data

US 2012/0062072 A1    Mar. 15, 2012

(30) Foreign Application Priority Data

Sep. 13, 2010    (JP) ................... 2010-204054

(51) Int. Cl.
*H01L 41/08*    (2006.01)

(52) U.S. Cl.
USPC ......................... 310/144; 310/365

(58) Field of Classification Search
USPC ................................. 310/341–343
See application file for complete search history.

(56) References Cited

U.S. PATENT DOCUMENTS

| | | | |
|---|---|---|---|
| 6,049,256 A * | 4/2000 | Fry ................... | 331/69 |
| 6,437,450 B1 | 8/2002 | Baba et al. | |
| 6,731,180 B1 * | 5/2004 | Clark et al. ............ | 331/176 |
| 7,394,163 B2 | 7/2008 | Baba et al. | |
| 7,514,852 B2 * | 4/2009 | Kasahara et al. ........... | 310/343 |
| 8,035,454 B2 * | 10/2011 | Navet ..................... | 331/69 |
| 2011/0175492 A1 * | 7/2011 | Stoffels et al. .............. | 310/343 |

FOREIGN PATENT DOCUMENTS

| | | |
|---|---|---|
| CN | 1320957 | 11/2001 |
| JP | 2000-233560 | 8/2000 |
| JP | 2005-26982 | 1/2005 |

OTHER PUBLICATIONS

Taiwanese Patent Office Action dated Nov. 28, 2013 in Application No. 100131497.
Taiwanese Patent Office Search Report dated Nov. 8, 2013 in Application No. 100131497.
Chinese Office Action dated Nov. 25, 2013 in Application No. 201110280404.
Chinese Office Action dated Nov. 25, 2013 in Application No. 201110280404.7 Yes.
Patent Abstracts of Japan, Publication No. 2005-026982, Published Jan. 27, 2005.
Japanese Patent Office Action issued in Japanese Patent Application No. 2010-204054 dated Mar. 11, 2014.

* cited by examiner

*Primary Examiner* — Mark Budd
(74) *Attorney, Agent, or Firm* — Staas & Halsey LLP

(57) ABSTRACT

A method of fabricating a crystal unit fills an adhesive from a first opening in a front surface of a mask of each of penetration holes in the mask in a state in which the mask is set on a base, into each penetration hole, and heats, by a heating element, a sidewall region defining a second opening in a back surface of the mask, in order to cure a sidewall part of the adhesive in the sidewall region defining each penetration hole in contact with the adhesive filling each penetration hole. A crystal blank is bonded on the base using the adhesive in order to form the crystal unit, after removing the mask from the base.

8 Claims, 8 Drawing Sheets

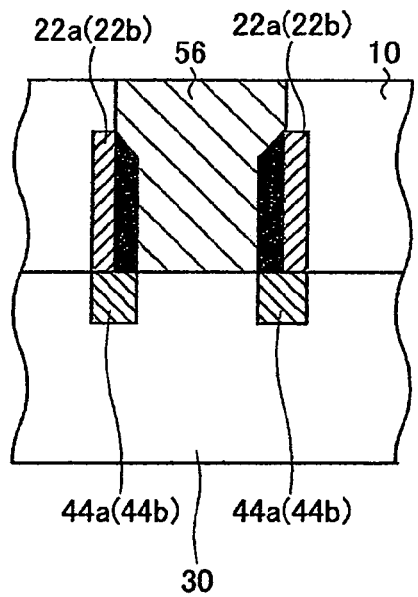
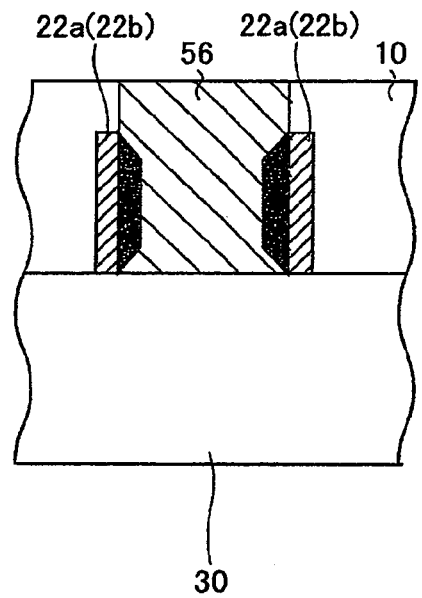
FIG.8A FIG.8B
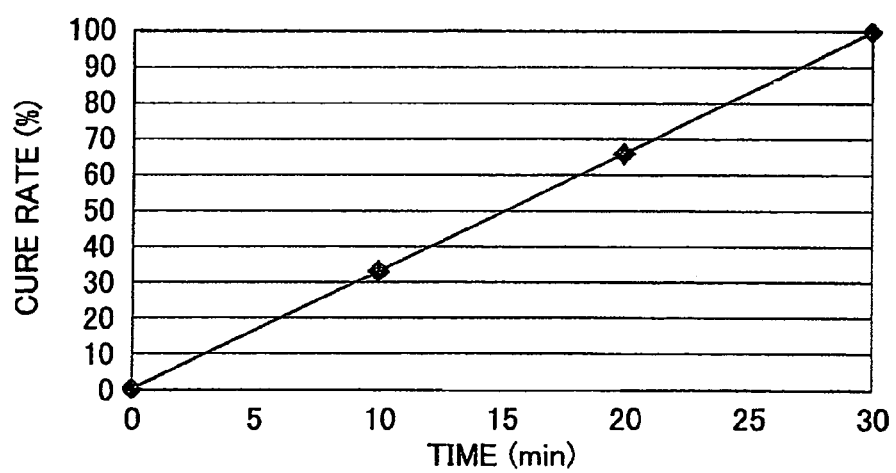
FIG.9

METHOD OF FABRICATING CRYSTAL UNIT, CRYSTAL UNIT FABRICATION MASK, AND CRYSTAL UNIT PACKAGE

CROSS-REFERENCE TO RELATED APPLICATIONS

This application is based upon and claims the benefit of priority of the prior Japanese Patent Application No. 2010-204054, filed on Sep. 13, 2010, the entire contents of which are incorporated herein by reference.

FIELD

The present invention relates to a method of fabricating a crystal unit, a crystal unit fabrication mask that is used when fabricating the crystal unit, and a crystal unit package that accommodates the crystal unit.

BACKGROUND

Currently, a conductive adhesive (or bonding agent) is used to mount a crystal blank of a crystal oscillator on a ceramic package of the crystal oscillator. A dispenser is used to coat the conductive adhesive on a base within the ceramic package.

FIGS. 1A and 1B are diagrams illustrating an example of a structure of an oscillator in related art.

As illustrated in a side view in FIG. 1A, an oscillator 100 includes a ceramic package 112, a crystal blank 114, and a circuit 116. The circuit 116 includes an oscillator circuit, a control circuit, an output buffer circuit, and the like. The crystal blank 114 and the circuit 116 are provided within the ceramic package 112.

As illustrated in a top view of FIG. 1B, a pair of excitation electrodes 118 is arranged to sandwich the crystal blank 114. A connection line 120 extends from each of the excitation electrodes 118 to a corresponding end part of the crystal blank 114 to connects to an electrode pad 122 provided on a base 112a of the ceramic package 112. The electrode pads 122 connect to the circuit 116 via a connection line (not illustrated). The electrode 118 on the crystal blank 114 is bonded to the base 112a by a conductive adhesive 124 in order to electrically connect to the corresponding electrode pad 122.

FIGS. 2A and 2B are diagrams illustrating another example of a structure of an oscillator in related art. In FIGS. 2A and 2B, those parts that are the same as those corresponding parts in FIGS. 1A and 1B are designated by the same reference numerals, and a description thereof will be omitted.

As illustrated in a side view of FIG. 2A, the ceramic package 112 has bases 112a and 112b.

As illustrated in a top view of FIG. 2B, a pair of connection lines 120 extend from the pair of excitation electrodes 118, in mutually opposite directions, to diagonally opposite end parts of the crystal blank 114 to connect to the pair of electrode pads 122 provided on the respective bases 112a and 112b of the ceramic package 112. The electrodes 118 on the crystal blank 114 are bonded to the respective bases 112a and 112b by the conductive adhesive 124 in order to electrically connect to the corresponding electrode pads 122.

FIGS. 3A through 3D are diagrams for explaining an example of an adhesive coating process for the oscillator illustrated in FIGS. 1A and 1B.

As illustrated in perspective views of FIGS. 3A, 3B and 3C, when coating the adhesive 124 on the base 112a, the dispenser 126 is lowered to a position where the electrode pad 122 is provided, the adhesive 124 is supplied from the dispenser 126 onto the base 112a, and the dispenser 126 is raised from the lowered position. But as illustrated in a top view of FIG. 3D, when a coating position of the adhesive 124 is slightly shifted or, a coating region of the adhesive 124 spreads, the coated adhesive 124 may project outside the electrode pad 122 to cause a slight difference in the bonding state of the crystal blank 114 depending on the positional shift or regional spread of the adhesive 124. Such a slight difference in the bonding state of the crystal blank 114 may cause an oscillation frequency of the oscillator 100 to become unstable with time or, may stop oscillation. Such a problem of the oscillator 100 illustrated in FIGS. 1A and 1B may occur in a similar manner in the case of the oscillator 100 illustrated in FIGS. 2A and 2B.

A known pattern forming method may be used to coat the adhesive. For example, the pattern forming method forms a pattern by filling a print material into an opening penetrating a printing plate, and printing the print material onto a target object. The printing plate may be removed from the target object after curing or semi-curing of the print material.

An example of a screen printing method is proposed in a Japanese Laid-Open Patent Publication No. 2000-233560.

Because the printing plate is removed from the target object after curing or semi-curing of the print material, the print material is unlikely to flow and cause a positional error of the pattern that is formed. However, when the pattern forming process is used to coat the adhesive, it may not be possible to bond the crystal blank 114 to the base 112a or to the bases 112a and 112b in a manner such that the oscillation frequency of the oscillator 100 is unaffected by the bonding.

SUMMARY

One aspect of the present invention is to provide a method of fabricating a crystal unit, a crystal unit fabrication mask, and a crystal unit package, which may stabilize an oscillation frequency.

According to one aspect of the present invention, there is provided a method of fabricating a crystal unit, that includes filling an adhesive from a first opening located on a front surface side of a mask of each of a plurality of penetration holes in the mask in a state in which the mask is set on a base, into each of the plurality of penetration holes; heating, by a first heating element, a sidewall region defining a second opening located on a back surface side of the mask at an opposite side from the first opening, in order to cure a sidewall part of the adhesive in the sidewall region, excluding a sidewall region defining the first opening, of a sidewall defining each of the plurality of penetration holes and in contact with the adhesive filled into each of the penetration holes; and bonding a crystal blank on the base using the adhesive on the base in order to form the crystal unit, after removing the mask from the base.

According to another aspect of the present invention, there is provided a crystal unit fabrication mask for use in fabricating a crystal unit, that includes a main body having a first surface and a second surface on an opposite end from the first surface, said main body including a plurality of penetration holes each having a first opening at the first surface and a second opening at the second surface; and a heating element configured to heat a sidewall region of the main body defining the second opening, excluding a sidewall region defining the first opening, of a sidewall of the main body defining each of the plurality of penetration holes.

According to still another aspect of the present invention, there is provided a crystal unit package that includes a crystal blank; a base having a region where the crystal blank is bonded thereto; and a heating element configured to heat at least the region of the base, wherein the crystal blank is bonded to the region of the base via an adhesive coated on the region.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 8A and 8B are diagrams for explaining curing of an adhesive;

FIG. 9 is a diagram illustrating an example of a time dependence of curing of the adhesive in one embodiment of the present invention.

DESCRIPTION OF EMBODIMENTS

Preferred embodiments of the present invention will be described with reference to the accompanying drawings.

A description will now be given of a method of fabricating a crystal unit, a crystal unit fabrication mask, and a crystal unit package in each embodiment according to the present invention.

The crystal unit is sometimes also referred to as a quartz crystal unit, a crystal resonator, a vibrating crystal, or simply a crystal.

[Crystal Unit Fabrication Mask]

Figure 1A:
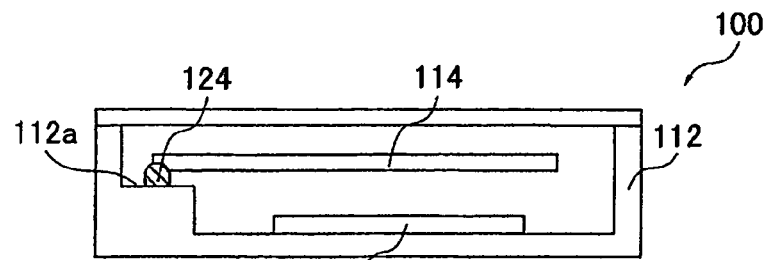
FIGS. 1A and 1B are diagrams illustrating an example of a structure of an oscillator in related art.
Figure 1B:
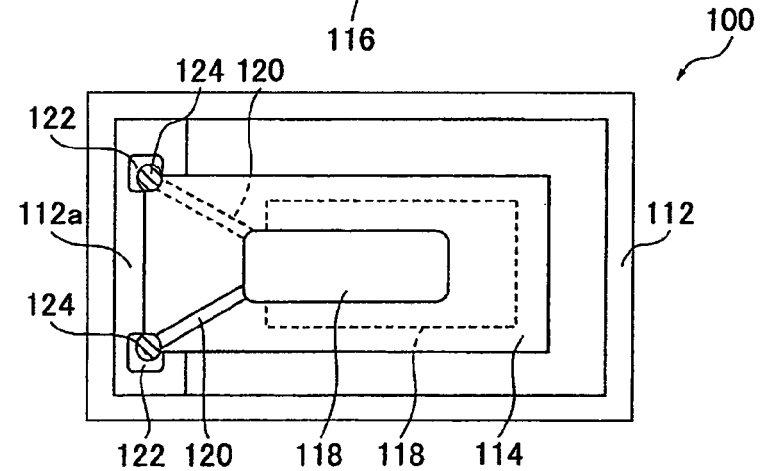
Figure 2A:
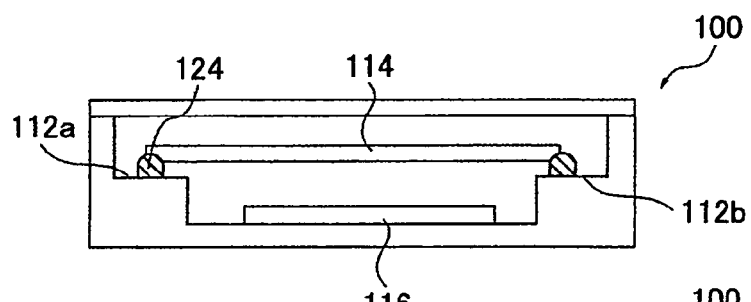
FIGS. 2A and 2B are diagrams illustrating another example of a structure of an oscillator in related art.
Figure 2B:
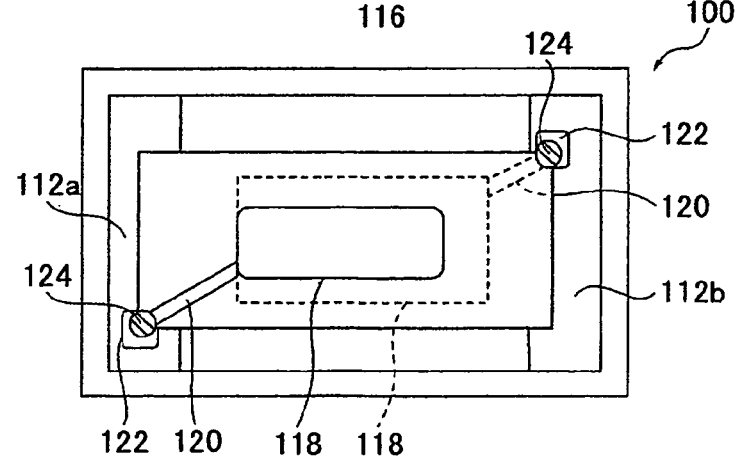
Figure 3A:
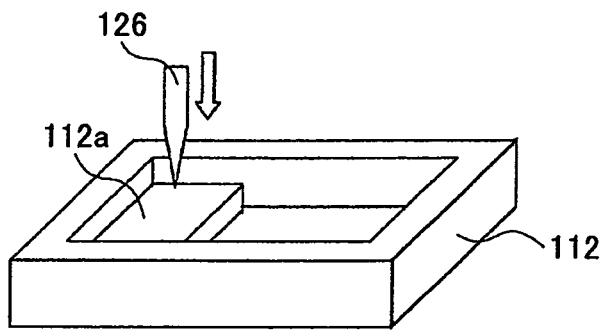
FIGS. 3A through 3D are diagrams for explaining an example of an adhesive coating process for the oscillator illustrated in FIGS. 1A and 1B.
Figure 3B:
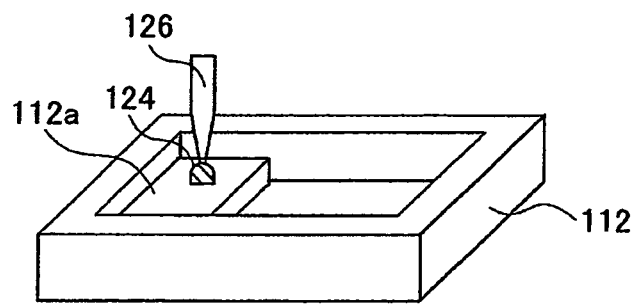
Figure 3C:
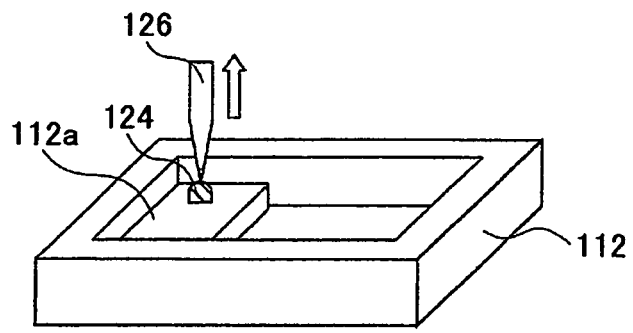
Figure 3D:
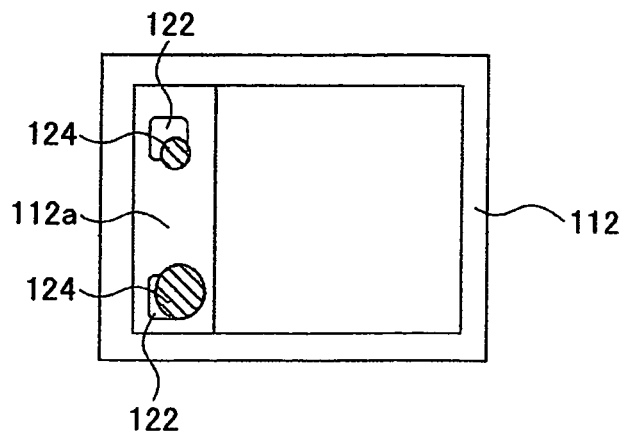
Figure 4A:
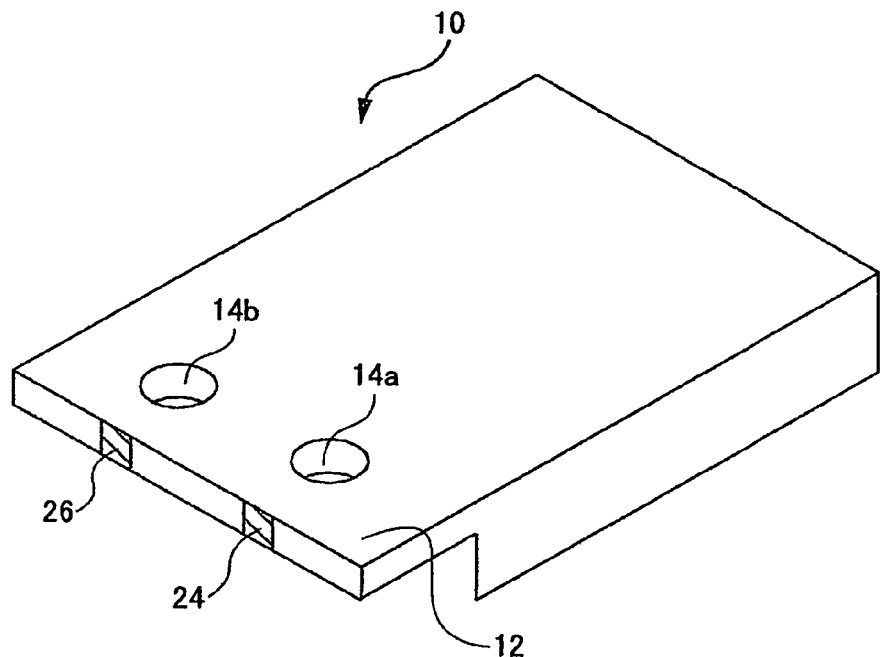
FIGS. 4A through 4C are diagrams illustrating an example of a crystal unit fabrication mask in one embodiment of the present invention.
Figure 4B:
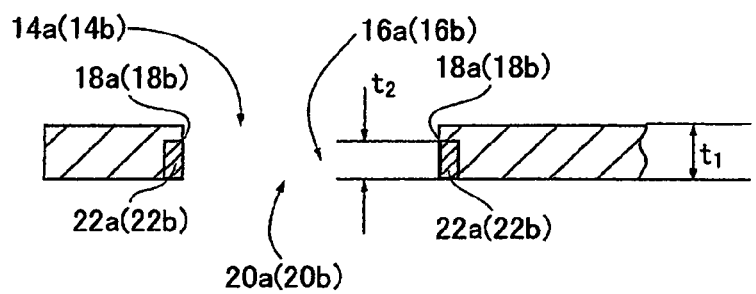
Figure 4C:
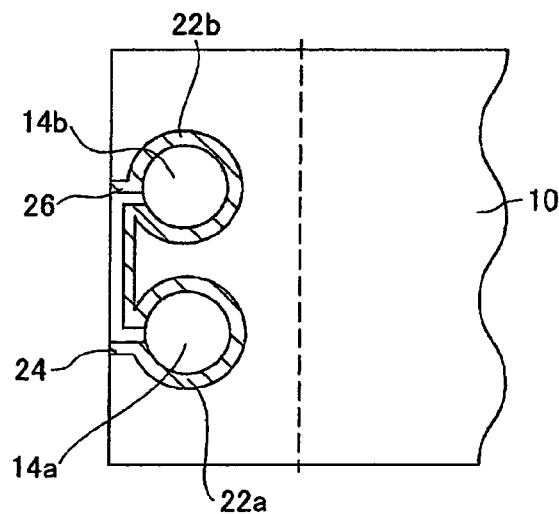

FIGS. 4A through 4C are diagrams illustrating an example of a crystal unit fabrication mask in one embodiment of the present invention. FIG. 4A illustrates a perspective view of a crystal unit fabrication mask (hereinafter simply referred to as a "mask") 10, FIG. 4B illustrates a cross sectional view of the mask 10 in a vicinity of penetration holes in the mask 10, and FIG. 4C illustrates a bottom view of heaters provided on the mask 10.

The mask 10 is used when bonding a crystal blank to a predetermined position within a ceramic package, in order to coat a thermosetting conductive adhesive (hereinafter simply referred to as an "adhesive"). The mask 10 is used to partially cure the adhesive in a predetermined shape when coating the adhesive at the predetermined position.

The mask 10 includes a main body having a predetermined thickness, with one end part having a reduced thickness, as illustrated in FIG. 4A. This end part having the reduced thickness will be referred to as a thin part 12 that forms a step with respect to the remainder of the mask 10. Two penetration holes (or through holes) 14a and 14b are provided in the thin part 12. As will be described later, each of the penetration holes 14a and 14b are provided to fill the adhesive from openings 16a and 16b in a front surface (or front side) of the mask 10 illustrated in FIG. 4B using a squeegee, in the shape of the penetration holes 14a and 14b. When the mask 10 makes contact with a base of the ceramic package which will be described later, a back surface (or back side) of the mask 10 makes contact with the base. The front surface of the mask 10 is the side that does not make contact with the base.

In the following, a description will be given of a structure in a vicinity of the penetration hole 14a. However, the structure in a vicinity of the penetration hole 14b is the same as that for the penetration hole 14a, and a description thereof will be omitted. Further, reference numerals of elements related to the vicinity of the penetration hole 14b will be illustrated in brackets, as may be seen from FIG. 4B, for example.

As illustrated in FIG. 4B, a heater 22a (22b) is provided, as a heating element, in a sidewall part 18a (18b) defining the penetration hole 14a (14b) and making contact with the adhesive filled from the opening 16a (16b). The heater 22a (22b) is provided to surround a periphery of the penetration hole 14a (14b) as illustrated in FIG. 4C, in order to heat the sidewall part 18a (18b) of the mask 10. The heater 22a (22b) may be formed by a wire having a relatively high resistance, such as a nichrome wire.

Power terminals 24 and 26 are provided on a side surface of the mask 10 and are electrically connected to the heater 22a (22b). When coating the adhesive in order to bond the crystal blank to the base within the ceramic package, power from a power supply (not illustrated) is supplied via the power terminals 24 and 26 to generate heat from the heater 22a (22b).

The heat is generated from the heater 22a (22b) in order to partially cure the adhesive in a state in which the adhesive is filled into the penetration hole 14a (14b).

As illustrated in FIG. 4B, the heater 22a (22b) is provided in the sidewall part 18a (18b) in a sidewall region on the side of an opening 20a (20b) in the back surface of the mask 10 on the opposite side from the opening 16a (16b). In other words, the heater 22a (22b) is provided in the sidewall part 18a (18b) excluding a sidewall region on the side of the opening 16a (16b) in the front surface of the mask 10. The heater 22a (22b) is not provided in the sidewall region on the side of the front surface of the mask 10, because the adhesive on the front surface of the mask 10 may not bond to the crystal blank when the curing of the adhesive progresses to the front surface of the mask 10.

On the other hand, the adhesive contacting the sidewall region on the side of the back surface of the mask 10 is cured using the heater 22a (22b), in order to prevent the adhesive in the vicinity of the sidewall region on the side of the back surface of the mask 10 from flowing before the crystal blank is placed on the adhesive and the adhesive cures, after the mask 10 is removed. By preventing the premature flowing of the adhesive before the adhesive cures, a positional error of the adhesive coated on the base in order to bond the crystal blank, from a preset position, may be suppressed. The heat generated from the heater 22a (22b) or, the heating temperature of the heater 22a (22b), is set to enable curing of the adhesive. For example, the heating temperature may be 150°

C. A heating time is controlled so that the adhesive in the region on the side of the front surface of the mask 100 will not be cured due to heat conduction of the adhesive.

In a case in which a thin part 12 of the mask 10 has a thickness $t_1$ (mm) and the heater 22a (22b) has a thickness $t_2$ (mm), $t_2/t_1$ is 0.8 to 0.9, for example. The thickness $t_2$ (mm) of the heater 22a (22b) is taken from the position of the opening 20a (20b) towards the opening 16a (16b) at the end part of the heater 22a (22b). For example, a height of the part of the heater 22a (22b) bonded to the crystal blank is 0.1 to 0.2 times the thickness $t_1$ of the thin part 12 of the mask 10. For example, the thickness $t_1$ of the thin part 12 of the mask 10 is 1 mm, and the penetration holes 14a and 14b have a hole diameter of 2 mm.

The positions of the penetration holes 14a and 14b in the mask 10 are aligned to the positions of electrode pads provided on the base of the ceramic package to which the crystal blank is bonded.

[Crystal Unit Package]

Figure 5A:
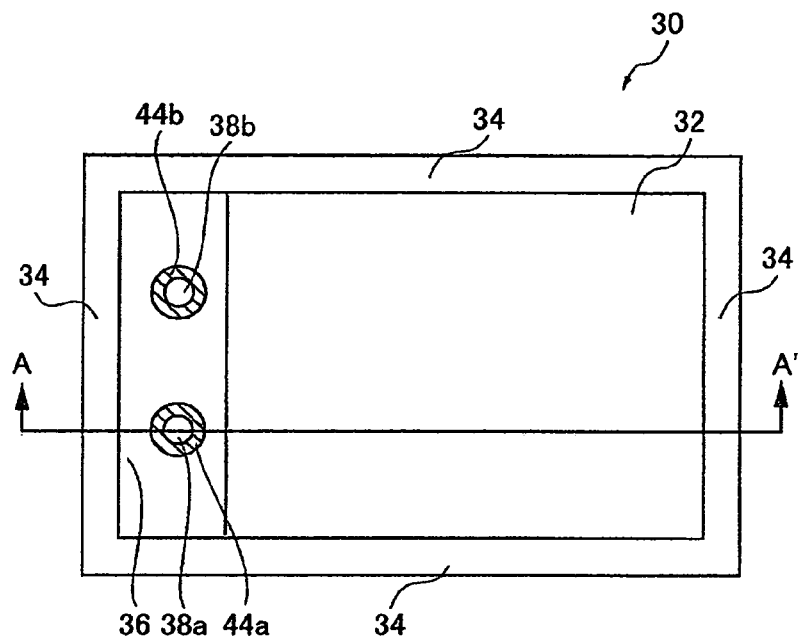
FIGS. 5A and 5B are diagrams illustrating an example of a crystal unit package in one embodiment of the present invention.
Figure 5B:
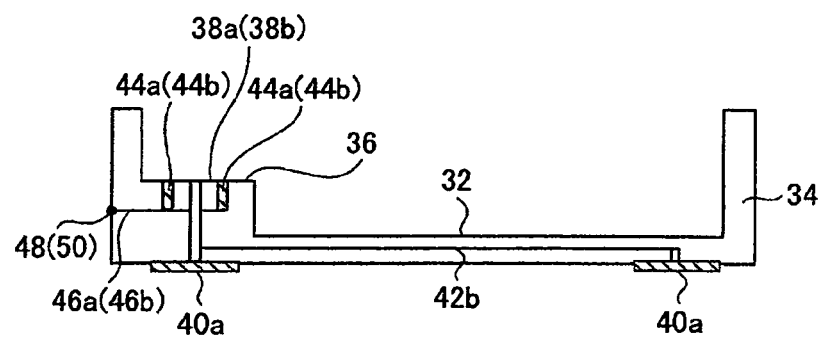

FIGS. 5A and 5B are diagrams illustrating an example of a crystal unit package (hereinafter simply referred to as a "package") in one embodiment of the present invention. FIG. 5B illustrates a cross sectional view along a line A-A' in FIG. 5A.

As illustrated in FIGS. 5A and 5B, a package 30 includes a bottom part 32, a sidewall part 34, and a base 36. The package 30 is made of a ceramic material, for example. The crystal blank is accommodated within the package 30, and the crystal blank is sealed within the package 30 when a lid (not illustrated) cover the top of the package 30.

The base 36 projects from an internal space within the package 30 and forms a step shape relative to the bottom part 32. Electrode pads 38a and 38b to be connected to electrodes of the crystal blank are provided on a surface of the base 36. The electrodes pads 38a and 38b connect to respective package pads 40a and 40b via conductor lines 42a and 42b, respectively. The package pads 40a and 40b connect to pads provided on a printed circuit board or a substrate (both not illustrated), in order to mount the crystal unit on the printed circuit board or the substrate.

Because the step shape of the mask 10 matches the step shape of the base 36, the mask 10 is accurately aligned to and is set in a region that is surrounded by the sidewall part of the package 30, when coating the adhesive on the base 36 using the mask 10. In this state, the penetration holes 14a and 14b of the mask 10 match the respective positions of the electrode pads 38a and 38b.

Heaters 44a and 44b are provided, as heating elements, on the surface of the base 36 in order to surround the respective electrode pads 38a and 38b. The heaters 44a and 44b are connected to power terminals 48 and 50 that are provided on an outer part of the sidewall part 34 of the package 30 via respective conductor lines 46a and 46b. Power from a power supply (not illustrated) is supplied via the power terminals 48 and 50 to generate heat from the heaters 44a and 44b. The power is supplied to the heaters 44a and 44b to generate the heat when using the mask 10 to coat the adhesive on the electrodes pads 38a and 38b and to partially cure the adhesive. A bottom part of the adhesive in contact with the electrode pads 38a and 38b is cured by the heat generated from the heaters 44a and 44b. The heating temperature of the heaters 44a and 44b may be the same as that for the heaters 22a and 22b, in order to cure the adhesive in a similar manner. That is, the heating temperature of the heaters 44a and 44b may be 150° C., for example. The curing of the adhesive may be controlled by the heating time of the heaters 44a and 44b.

[Method of Fabricating Crystal Unit]

Figure 6A:
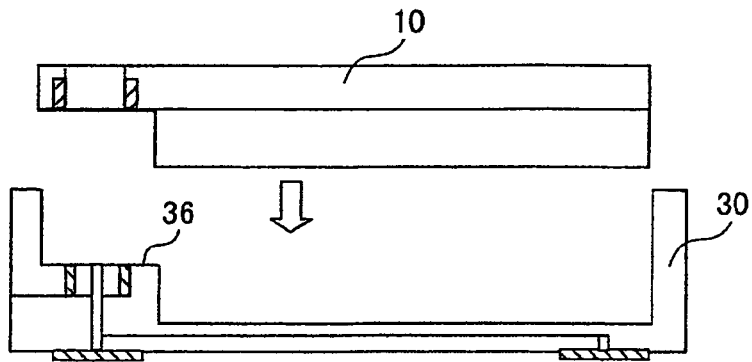
FIGS. 6A through 6C are diagrams for explaining a method of fabricating a crystal unit in one embodiment of the present invention.
Figure 6B:
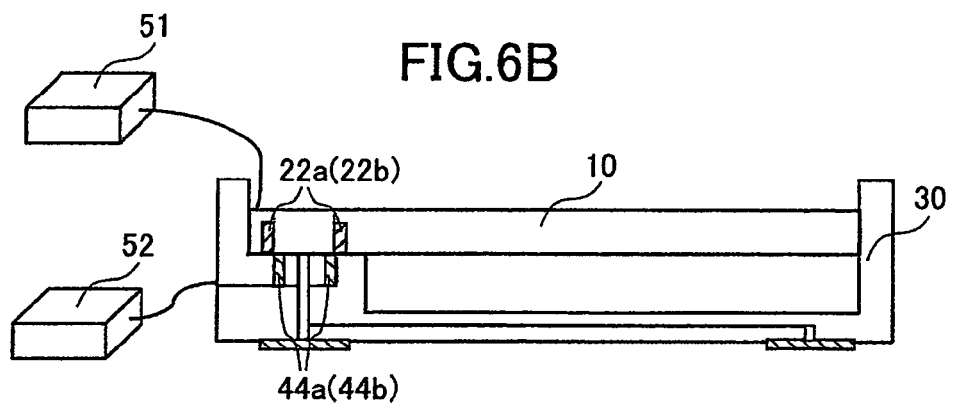
Figure 6C:
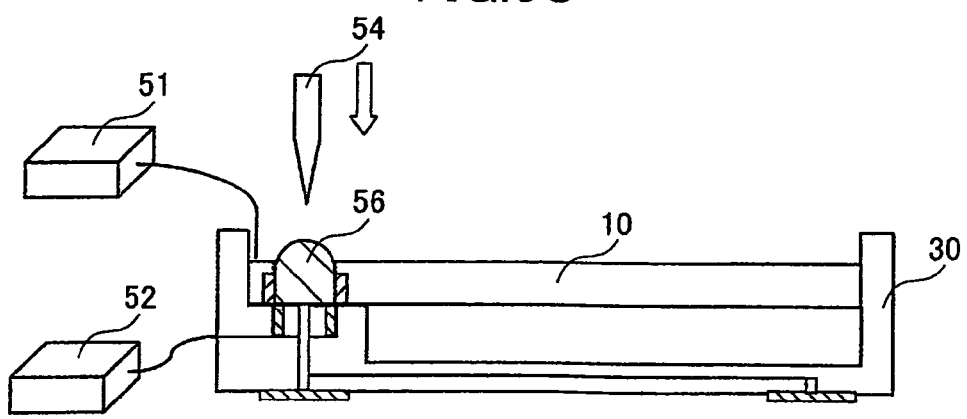

FIGS. 6A through 6C are diagrams for explaining a first half of a process in a method of fabricating a crystal unit in one embodiment of the present invention. FIGS. 7A through 7E are diagrams for explaining a second half of the process in the method of fabricating the crystal unit in the one embodiment of the present invention.

First, the mask 10 described above and the package 30 described above are prepared, as illustrated in FIG. 6A. Because the step shape of the mask 10 matches or corresponds to the step shape of the package 30 at the base 36, the mask 10 may be set at a predetermined, aligned position on the package 30 as illustrated in FIG. 6B. In this state, the positions of the penetration holes 14a and 14b of the mask 10 match the positions of the electrode pads 38a and 38b.

As illustrated in FIG. 6B, a power supply 51 is connected to the heaters 22a and 22b via the power terminals 24 and 26 provided on the side surface of the mask 10. On the other hand, a power supply 52 is connected to the heaters 44a and 44b via the power terminals 48 and 50 provided on the sidewall part 34 of the package 30.

Next, as illustrated in FIG. 6C, a dispenser 54 is used to coat a predetermined amount of an adhesive 56 within the penetration holes 14a and 14b of the mask 10, as illustrated in FIG. 6C. For example, a screw compressor type dispenser, an air compressor type dispenser, and the like may be used for the dispenser 54.

Figure 7A:
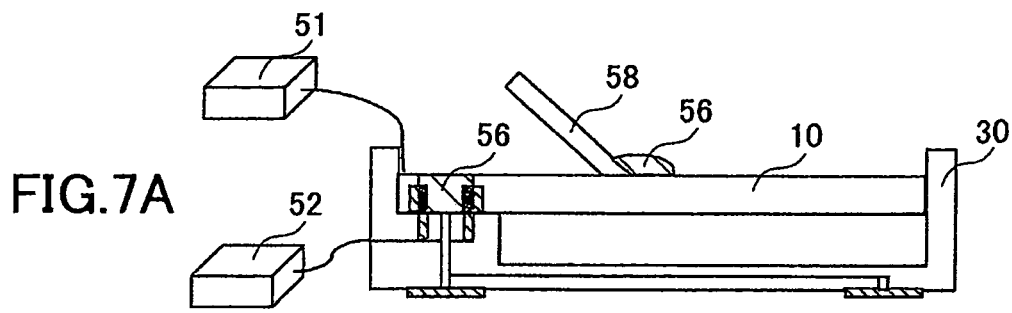
FIGS. 7A through 7E are diagrams for explaining the method of fabricating the crystal unit in the one embodiment of the present invention.

Then, as illustrated in FIG. 7A, a squeegee 58 is used to fill the adhesive 56 within the penetration holes 14a and 14b in the mask 10, and excessive adhesive 56 is removed. In this state, the power supplies 51 and 52 supply the power to the heaters 22a and 22b of the mask 10 and to the heaters 44a and 44b of the package 30, in order to heat the adhesive 56 within the penetration holes 14a and 14b.

FIGS. 8A and 8B are diagrams for explaining curing of the adhesive. The adhesive 56 within the penetration holes 14a and 14b may be cured in a periphery of the bottom part and the bottom sidewall part thereof, as indicated in solid black in FIG. 8A, when the heaters 22a and 22b and the heaters 44a and 44b generate the heat. On the other hand, the adhesive 56 in parts other than the periphery of the bottom part and the bottom sidewall part thereof may be maintained in a non-cured state (or semi-cured state).

When the heaters 44a and 44b are not provided or, the heaters 44a and 44b generate no heat, the adhesive 56 in the periphery of the bottom part thereof may not be cured sufficiently, as illustrated in FIG. 8B. In this case, when the mask 10 is removed from the package 30, the adhesive 56 in the non-cured state (or semi-cured state) may flow from the bottom part thereof, to thereby cause the bonding part to spread when thereafter bonding the crystal blank on the package 30. For this reason, it may be preferable to heat and cure the adhesive 56, within the penetration holes 14a and 14b, in the periphery of the bottom part and the bottom sidewall part thereof, using the heaters 44a and 44b of the package 30.

In this embodiment, the adhesive 56 in the periphery of the bottom part thereof is heated and cured using the heaters 44a and 44b. However, a heating surface may be formed by the heaters 44a and 44b in order to heat the entire bottom part of the adhesive 56.

FIG. 9 is a diagram illustrating an example of a time dependence of curing of the adhesive in one embodiment of the present invention. In this example, a conductive adhesive made of an epoxy resin including silver (Ag) is used for the adhesive 56. In FIG. 9, the ordinate indicates the cure rate (%), and the abscissa indicate the time in minutes (min). The cure rate indicates the extent of the curing. The heating temperature was set to 150° C. As may be seen from FIG. 9, the cure rate is 100% in 30 minutes, that is, the entire adhesive 56 cures in 30 minutes. On the other hand, the cure rate is 33% in 10 minutes, and at this point in time, the adhesive 56 is cured only in the periphery of the bottom part and the bottom sidewall part thereof. The bottom sidewall part of the adhesive 56 is the part making contact with the sidewall region on the side of the back surface of the mask 10 where the heaters 22a and 22b are provided.

By suitably adjusting the heating times of the heaters 22a and 22b and the heaters 44a and 44b, the adhesive 56 may be heated and cured only in the periphery of the bottom part and the bottom sidewall part thereof.

Figure 7B:
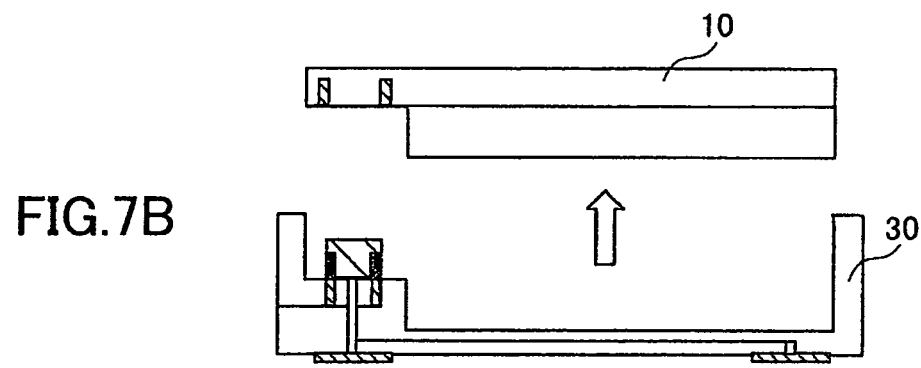
Figure 7C:
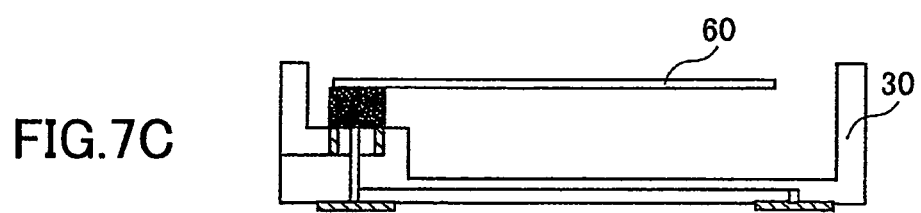

Next, the mask 10 is removed from the package 30 as illustrated in FIG. 7B. In this state, the adhesive 56 is cured in the periphery of the bottom part and the bottom sidewall part thereof, and the adhesive 56 is unlikely to loose shape. Although the top part of the adhesive 56 is in the non-cured state (or semi-cured state), the top part of the adhesive 56 is supported by the periphery of the bottom part and the bottom sidewall part of the adhesive 56 and is unlikely to flow. In this state, a crystal blank 60 is bonded to the base 36 of the package 30 via the adhesive 56, as illustrated in FIG. 7C. In order to enable oscillation of the crystal blank 60, electrode pads (not illustrated) connected to a pair of electrodes (not illustrated) that are provided on both primary surfaces of the crystal blank 60 are electrically connected to the electrode pads 38a and 38b provided on the base 36, via the adhesive agent 56 that is conductive.

Figure 7D:
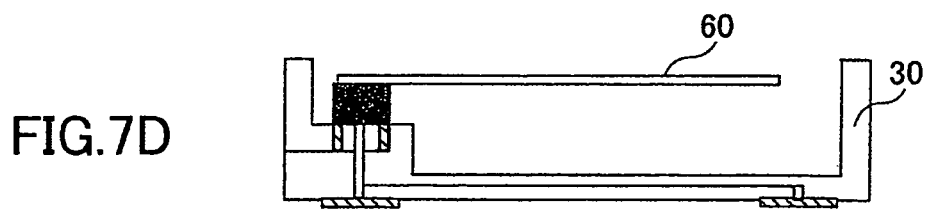

Next, the package 10 provided with the crystal blank 60 is placed in an environment at a temperature on the order of 150° C., for example, and the adhesive 56 cures in its entirety as illustrated in FIG. 7D.

Figure 7E:
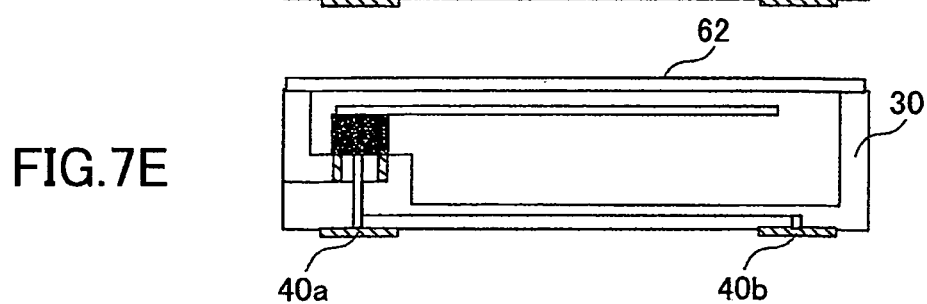

Thereafter, a lid 62 is placed on top of the package 30 to cover and seal the crystal blank 60, as illustrated in FIG. 7E.

The crystal unit that is fabricated in the above described manner may be mounted on a target base (not illustrated), such as a printed circuit board, a wiring board, and a substrate, by connecting the package pads 40a and 40b to corresponding pads provided on the target base.

In this embodiment, the sidewall region on the side of the back surface of the mask 10 is heated by the heaters 22a and 22b at the openings 20a and 20b in order to cure the adhesive 56 in the bottom sidewall part thereof, in order to cure the adhesive 56 prior to removing the mask from the base 36. Thereafter, the crystal blank 60 is bonded to the base 36 using top part of the adhesive 56 in the non-cured state (or semi-cured state). Hence, a constant region may always be provided as the bonding part to bond the crystal blank 60 on the base 36, to thereby suppress instability of the oscillation frequency of the crystal unit and stabilize the oscillation frequency.

Figure 10:
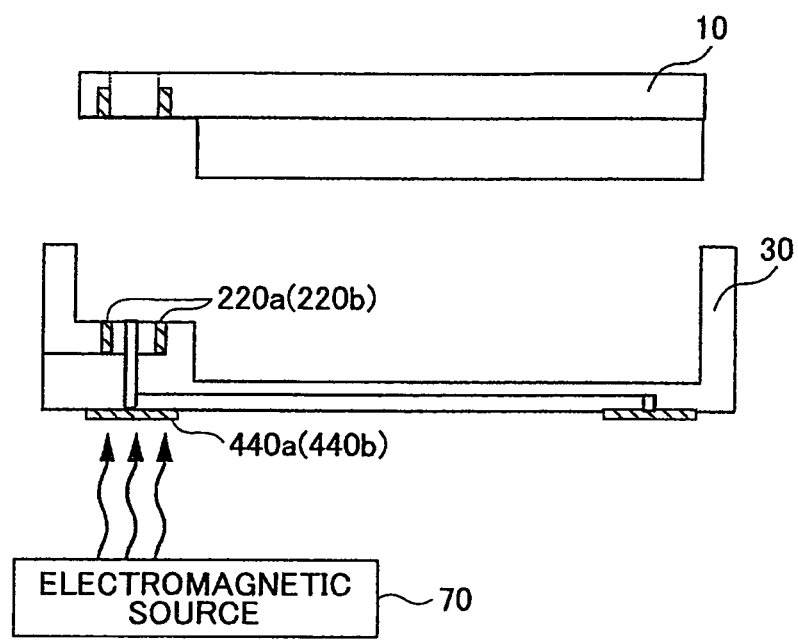
FIG. 10 is a diagram for explaining a crystal unit fabrication mask and a crystal unit package in another embodiment of the present invention.

In the embodiment described above, the adhesive 56 is heated by the heaters 22a and 22b and the heaters 44a and 44b. However, heating metal members 220a, 220b, 440a and 440b which heat the adhesive 56 by induction heating, as illustrated in FIG. 10, may be provided as heating elements in place of the heaters 22a, 22b, 44a and 44b. FIG. 10 is a diagram for explaining a crystal unit fabrication mask and a crystal unit package in another embodiment of the present invention. In FIG. 10, those parts that are the same as those corresponding parts in FIG. 6A are designated by the same reference numerals, and a description thereof will be omitted.

In FIG. 10, in a state in which the mask 10 is set on the package 30 and the adhesive 56 is filled into the penetration holes 14a and 14b, an electromagnetic source 70 generates electromagnetic waves to heat the heating metal members 220a, 220b, 440a and 440b and partially cure the adhesive 56, in a manner similar to the case in which the heaters 22a, 22b, 44a and 44b are provided.

Although the embodiments are numbered with, for example, "first," "second," or "third," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contribute by the inventor to furthering the art, and are to be construed as being without limitation to such specifically recited examples and conditions, nor does the organization of such examples in the specification related to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A crystal unit package comprising:
   a crystal blank;
   a base having a region where the crystal blank is bonded;
   an electrode pad, provided in the region of the base, and coupled to an electrode of the crystal blank;
   an adhesive coated on the region; and
   a heating element, provided in the region of the base, and configured to heat at least the region of the base,
   wherein the crystal blank is bonded to the region of the base via the adhesive, and
   wherein the heating element surrounds the electrode pad.

2. The crystal unit package as claimed in claim 1, further comprising:
   terminals coupled to the heating element and configured to receive power, wherein the terminals are provided on an outer side surface of the base.

3. The crystal unit package as claimed in claim 1, wherein the heating element has a shape to heat a peripheral portion of the region, to thereby heat a peripheral portion of the adhesive.

4. The crystal unit package as claimed in claim 3, wherein the heating element has a ring shape.

5. A crystal unit package comprising:
   a crystal blank;
   a base having a region where the crystal blank is bonded;
   an electrode pad, provided in the region of the base, and coupled to an electrode of the crystal blank;
   an adhesive coated on the electrode pad; and
   a heating element, provided in the region of the base, and configured to heat at least the region of the base,
   wherein the crystal blank is bonded to the region of the base via the adhesive, and
   wherein the heating element surrounds the electrode pad.

6. The crystal unit package as claimed in claim 5, further comprising:
   terminals coupled to the heating element and configured to receive power, wherein the terminals are provided on an outer side surface of the base.

7. The crystal unit package as claimed in claim 5, wherein the heating element has a shape to heat a peripheral portion of the region, to thereby heat a peripheral portion of the adhesive.

8. The crystal unit package as claimed in claim 7, wherein the heating element has a ring shape.

* * * * *